United States Patent
Kim et al.

(10) Patent No.: US 7,576,008 B2
(45) Date of Patent: Aug. 18, 2009

(54) METHOD FOR FORMING BURIED CONTACT ELECTRODE OF SEMICONDUCTOR DEVICE HAVING PN JUNCTION AND OPTOELECTRONIC SEMICONDUCTOR DEVICE USING THE SAME

(75) Inventors: Tae Su Kim, Daejeon (KR); Bu Gon Shin, Daejeon (KR); Jae Sung You, Seoul (KR); Hyun Woo Shin, Gwacheon-si (KR)

(73) Assignee: LG Chem Ltd., Seoul (KR)

( * ) Notice: Subject to any disclaimer, the term of this patent is extended or adjusted under 35 U.S.C. 154(b) by 296 days.

(21) Appl. No.: 11/526,690

(22) Filed: Sep. 26, 2006

(65) Prior Publication Data
US 2007/0068570 A1     Mar. 29, 2007

(30) Foreign Application Priority Data
Sep. 27, 2005   (KR) ............... 10-2005-0089670

(51) Int. Cl.
*H01L 21/311* (2006.01)
(52) U.S. Cl. ............... 438/694; 438/21; 438/695; 438/702; 438/759; 216/65; 216/94; 505/410
(58) Field of Classification Search ............... 438/21, 438/694, 695, 702, 759
See application file for complete search history.

(56) References Cited

U.S. PATENT DOCUMENTS 7,005,324 B2 * 2/2006 Imai ............... 438/113
7,259,047 B2 * 8/2007 Huang et al. ............... 438/149
2004/0258842 A1 * 12/2004 Hamaya ............... 427/409
2005/0158668 A1 * 7/2005 Bittner et al. ............... 430/322

FOREIGN PATENT DOCUMENTS

| KR | 1020040017183 A | 2/2004 |
| KR | 1020040086601 A | 10/2004 |
| KR | 1020040099135 A | 11/2004 |
| KR | 1020040102321 A | 12/2004 |
| WO | WO 2004/055920 A2 | 7/2004 |

* cited by examiner

Primary Examiner—Thanh V Pham
(74) Attorney, Agent, or Firm—McKenna Long & Aldridge LLP

(57) ABSTRACT

Disclosed is a method for manufacturing an optoelectronic semiconductor device having a p-n junction diode, which includes the steps of: (a) etching at least one surface of the p-n junction diode in a depth direction to form a plurality of continuous, isolated or mixed type electrode pattern grooves with a certain array; and (b) filling the formed grooves with a conductive ink containing a transparent conducting particle through an inkjet and then performing heat treatment to form a buried transparent electrode, the optoelectronic semiconductor device, and an apparatus for manufacturing the optoelectronic semiconductor device. In the present invention, covering loss is significantly reduced due to a buried transparent electrode so that the high efficiency of photoelectric conversion can be implemented, and there can be provided the easiness of a manufacturing process and the enhancement of productivity through the unification of etching and electrode forming processes.

8 Claims, 4 Drawing Sheets

METHOD FOR FORMING BURIED CONTACT ELECTRODE OF SEMICONDUCTOR DEVICE HAVING PN JUNCTION AND OPTOELECTRONIC SEMICONDUCTOR DEVICE USING THE SAME

This application claims the benefit of the filing date of Korean Patent Application No. 2005-0089670, filed on Sep. 27, 2005, in the Korean Intellectual Property Office, the disclosure of which is incorporated herein in its entirety by reference.

TECHNICAL FIELD

The present invention relates to a method for forming an electrode of a p-n semiconductor device, and more particularly to a method for forming a buried electrode of an optoelectronic semiconductor device such as a solar cell or light emitting diode (LED), an optoelectronic semiconductor device having a buried transparent electrode manufactured through the method, and an apparatus for manufacturing the optoelectronic semiconductor device.

BACKGROUND ART

A solar cell is a semiconductor device for converting solar energy into electric energy. It has been known that, after E. Becquerel discovered the photoelectric effect in 1839 for the first time, a Se cell with 1 to 2% efficiency was first used for an exposure device of a camera through studies on the photoelectric effect of Se by H. Hertz in 1870. Thereafter, the solar cell was used in military equipment such as a power source of a satellite in the late 1950's, during the initial stage of development. However, commercialization has led to rapid progress since various countries invested immense research funds for the purpose of using the solar cell as alternative energy under the influence of the oil shock in 1970's.

A solar cell uses the photovoltaic effect of a semiconductor, and manufactured by combining p-type and n-type semiconductors. If light is incident onto a portion (p-n junction) where the p-type and n-type semiconductors are joined together, negative charges (electrons) and positive charges (holes) are produced by light energy within a semiconductor. Theses electrons and holes move to n-type and p-type semiconductor layers while being separated at an energy barrier interposed there between such that they are gathered to both electrodes, respectively. Since, if such two electrodes are connected through a conducting wire, a current flows, it can be used as electric power outside.

FIG. 1 is a view showing a structure of a general semiconductor solar cell. The structure of the solar cell includes: a p-n junction structure in which p-type and n-type semiconductors that can be easily seen in a diode, LED or the like are joined together; upper and lower electrodes 11 and 15; and an anti-reflection (AR) layer 12 for reducing the reflection loss of and light. If a semiconductor absorbs light (photons) due to the photoelectric effect in view of a property of the semiconductor, free electrons and holes are produced, and photon energy absorbed while these free electrons and holes are being recombined is converted into photon energy such as heat in a general semiconductor. However, the positions of the free electrons and holes existing in the vicinity of the p-n junction are changed with each other due to an electromagnetic field around the p-n junction so that an electric potential is formed in a solar cell. As a result, if an external device is connected to the solar cell, a current flows.

However, such a solar cell has a problem in that its efficiency is currently low and it is a high-priced device. Actually, the primary problem that should be solved for the purpose of commercializing the solar cell is to enhance the efficiency of the solar cell. One of reasons for the low efficiency caused by the solar cell is covering loss by the upper electrode 11 thereof. The solar cell provided with a p-n junction structure should perform metal bonding to respectively form electrodes on both surfaces of the junction. However, since metal is generally an opaque substance, light is not transmitted through the bonding portion, and an area as broad as the bonding portion is not used so that efficiency is lowered. If the metal bonding is accomplished only on a portion of the junction surface in order to extend an area through which light is transmitted, the resistance of the solar cell is increased because the resistance of silicon itself practically used as a substrate for a p-n junction diode is large. Such an increase of the resistance increases energy loss. Thus, the aforementioned problem can be improved using buried bonding.

FIG. 2a is a view showing a section of a buried contact solar cell. A buried contact is formed by engraving a groove on a top of the solar cell using a laser or a mechanical method, and then forming a metal electrode 23a in the groove. In a case where such a method is used, there is an advantage in that the contact resistance and covering loss of the solar cell are simultaneously reduced, and there is benefit of the reduction effect of a dead cell through a partial doping, the enhancement of a light response property in a short wavelength band, and the like. However, the aforementioned metal bonding formation of the buried contact generally uses a squeezee method or electroplating method. Since there is a problem of the uniformity of paste amount for forming a metal wiring in a case where the squeezee method is used, there is a problem in that a metal substance filled with a groove 23b protrudes outside the groove so that the security of a fixed line width is difficult and even the metal wiring is cut (see FIG. 2b). Further, since a seed metal is formed through electroless plating before electroplating, and then the electroplating additionally progresses in a case where the electroplating is used, there is a problem in that the efficiency of a process is low, and a throughput is lowered due to a low electrodeposition speed in a case of mass production.

BRIEF DESCRIPTION OF THE DRAWINGS

The foregoing and other objects, features and advantages of the present invention will become more apparent from the following detailed description when taken in conjunction with the accompanying drawings in which.

BRIEF DESCRIPTION OF THE INDICATIONS IN THE DRAWINGS

Figure 1:
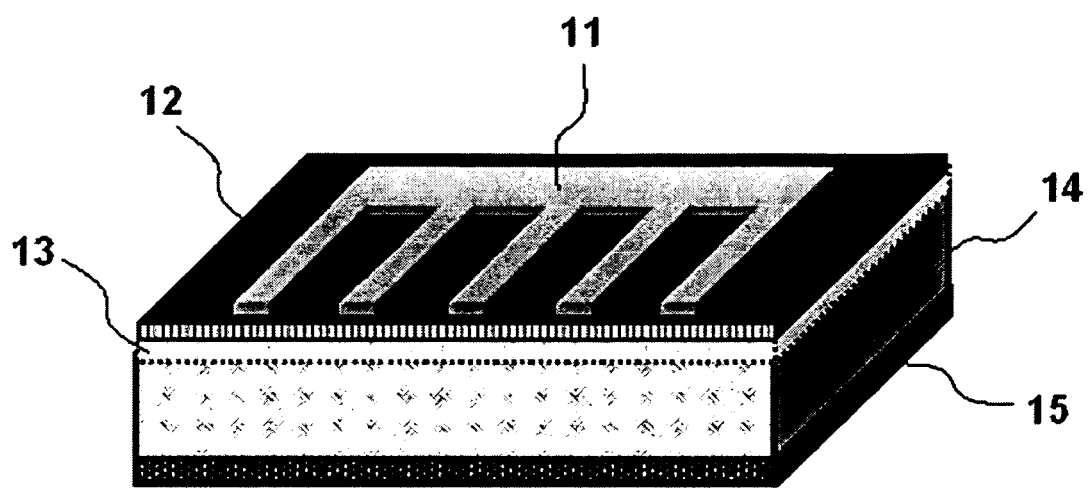
FIG. 1 is a schematic view of a general p-n junction semiconductor solar cell.

11: upper electrode of solar cell
12: anti-reflection (AR) layer
13: n-type semiconductor
14: p-type semiconductor
15: contact electrode positioned on a rear surface
21: n-type semiconductor
22: n-type semiconductor by double doping n-type impurities
23a: buried contact electrode (upper electrode) formed through a Inkjet method
23b: buried contact electrode (upper electrode) formed through a Squeezee method
24: p-type semiconductor
25: contact electrode positioned on a rear surface

DISCLOSURE OF THE INVENTION

Therefore, the present invention has been made by the present inventors in view of the above-mentioned problems, and one or more continuous, isolated or mixed type electrode pattern grooves with a certain array are formed on a top of a solar cell through etching possible for fine patterning implementation and then filled with a transparent conducting particle using an inkjet method to form a buried transparent electrode so that the high efficiency of an optoelectronic semiconductor device can be implemented through the enhancement of a degree of freedom for electrode pattern formation and the reduction of significant covering loss due to the transparent electrode. Further, a problem can be solved in that a seed electrode should be essentially inserted for the squeeze and plating methods in which the implementation of the uniform line width and thickness of a conventional electrode material is not easy, and the throughput of a manufacturing process and efficiency can be enhanced.

Accordingly, it is an object of the present invention to provide an optoelectronic semiconductor device for promoting high efficiency and a method for manufacturing the optoelectronic semiconductor device.

Further, it is another object of the present invention to provide an apparatus for manufacturing the optoelectronic semiconductor device for promoting the easiness of a manufacturing process and the enhancement of productivity through the unification of etching and electrode forming processes.

According to an aspect of the present invention, there is provided a method for manufacturing an optoelectronic semiconductor device having a p-n junction diode, which includes the steps of: (a) etching at least one surface of the p-n junction diode in a depth direction to form a plurality of continuous, isolated or mixed type electrode pattern grooves with a certain array; and (b) filling the formed grooves with a conductive ink containing a transparent conducting particle through an inkjet and then performing heat treatment to form a buried transparent electrode.

Further, according to another aspect of the present invention, there is provided an optoelectronic semiconductor device, which includes: (a) a p-n junction diode; and (b) a buried electrode positioned within a plurality of recesses with a certain array formed by etching a portion of a light incident surface of the p-n junction diode, wherein the electrode is a transparent electrode formed from a transparent conducting oxide through which incident light is transmitted.

Furthermore, according to a further aspect of the present invention, there is provided an apparatus for manufacturing an optoelectronic semiconductor device, which includes: (a) an etching device for forming one or more electrode pattern grooves with a certain array on one or both surfaces of a p-n junction diode; and (b) an inkjet device for forming an electrode by filling the formed grooves with a conductive substance through an inkjet, wherein the etching and inkjet devices are mounted on a single stage to manufacture a buried electrode through a unified manufacturing process.

BEST MODE FOR CARRYING OUT THE INVENTION

Reference will now be made in detail to the preferred embodiments of the present invention.

The present invention provides an optoelectronic semiconductor device, preferably a Buried Contact Solar Cell (BCSC), and includes a transparent electrode using a transparent conducting particle that is not formed through a conventional electrode forming method such as an electroplating method as a component of the device.

Particularly, the present invention has been accomplished by recognizing the importance of the relation between etching and electrode forming processes in a conventional buried contact electrode forming technique in the present invention. Accordingly, there can be provided a characteristic of an optoelectronic semiconductor device in which the throughput of a manufacturing process is enhanced, the reliability of the width of a electrode wiring and the degree of freedom of an electrode pattern are enhanced, and uniformity and photoelectric conversion efficiency are improved.

Figure 2:
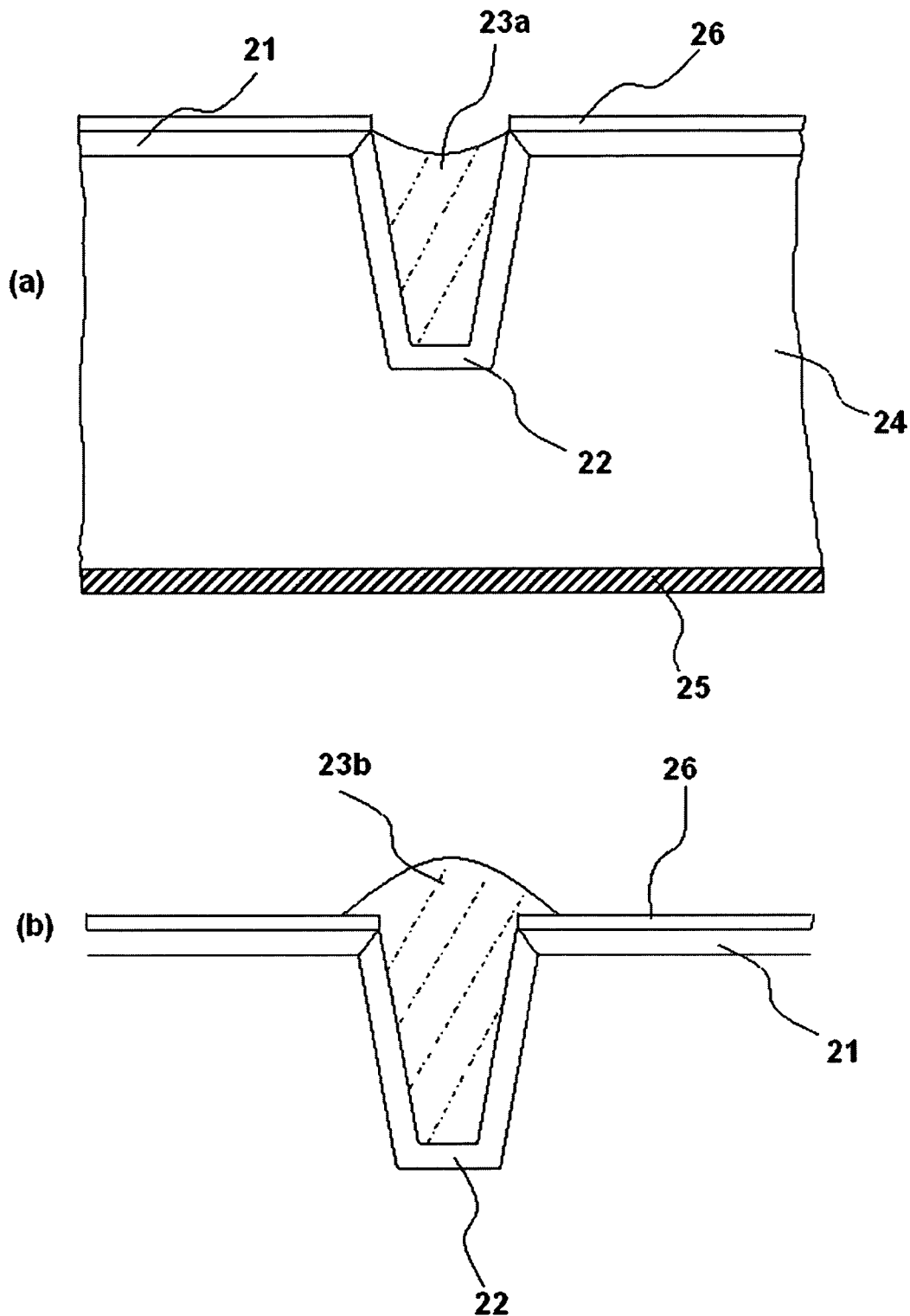
FIG. 2a is a partial sectional view of a p-n junction semiconductor solar cell having a general buried contact electrode (upper electrode)
FIG. 2b is a partial sectional view of a p-n junction semiconductor solar cell having a general buried contact electrode (upper electrode) formed through a conventional squeezee method.

That is, in the conventional buried contact electrode forming technique, a metal bonding, i.e., a metal electrode is formed by filling a groove previously formed on a p-n junction diode using a squeezee or electroplating method. In a case where the squeezee method is used, the metal bonding is not limited to the groove but may be protruded up to a top portion of the groove as shown in FIG. 2b. Further, in order to prevent this, in a case where an amount of squeezee is reduced, there is a problem in that the metal wiring is shorted. Furthermore, in a case where the electroplating that is a wet method is used as the other of the buried contact techniques, there is a disadvantage in that the insertion of a seed electrode for plating a bottom portion of the groove is necessarily required, and it takes a long period time to form a metal electrode through electrodeposition.

Figure 4:
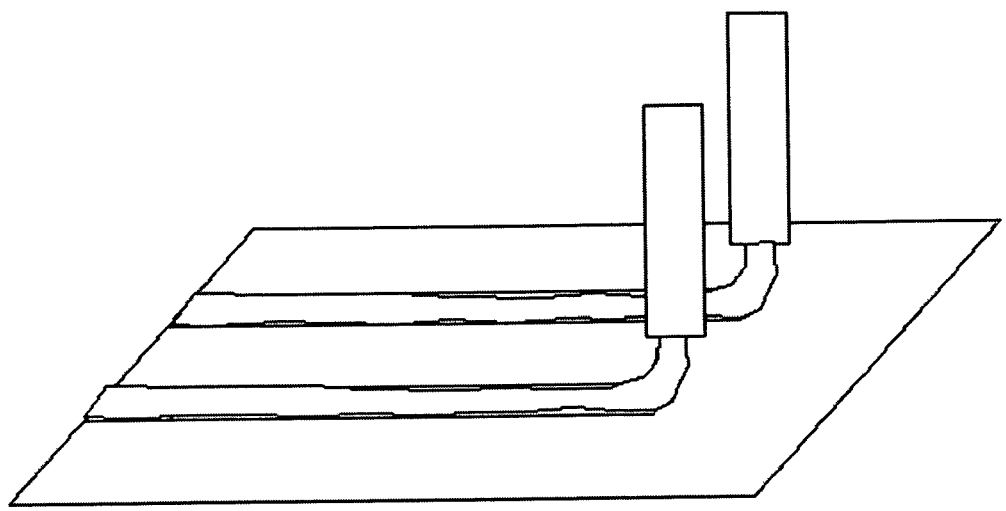
FIG. 4 is a conceptual view illustrating a process of fill grooves from on a surface of a substrate through the conventional squeezee method.
Figure 5:
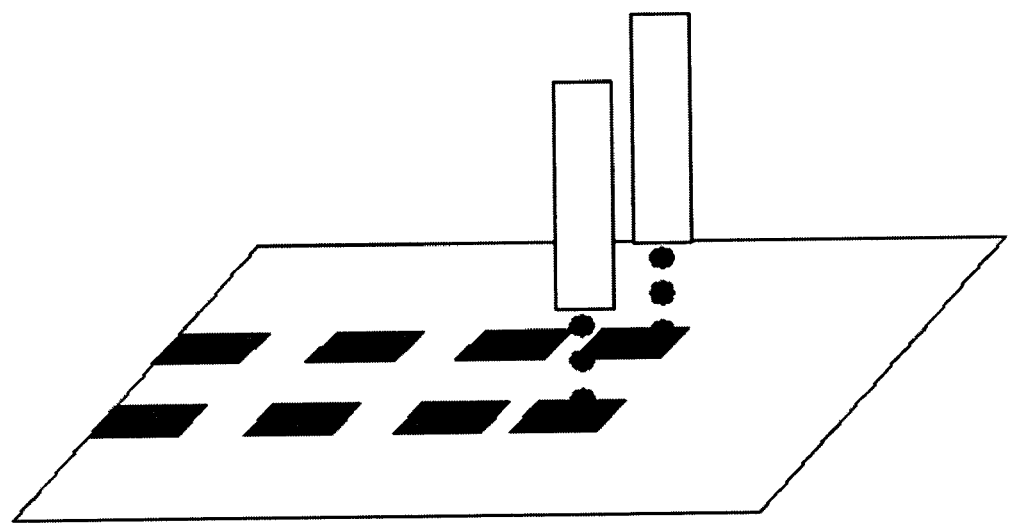
FIG. 5 is a conceptual view a process of filling grooves formed on a surface of a substrate through an ink jet method according to the present invention.

On the contrary, an electrode is formed through an inkjet method using a conductive ink in which a conductive particle is dispersed into a dispersing medium in the present invention. The inkjet method is a method of forming an electrode by filling a previously etched electrode pattern groove with the conductive ink, in which a conductive particle is dispersed into a dispersing medium, through a jetting method. At this time, since the conductive ink is filled in a droplet form differently from a conventional squeeze method, there is an advantage in that ink filling for a narrower line width is easy, and a metal wiring with a uniform thickness can be obtained. Further, there is an advantage in that it is unnecessary to form a seed electrode for electroplating, and the electrode formation speed through the inkjet method is faster than the electrodeposition speed through the conventional electroplating method. Particularly, since the inkjet method is possible to implement an isolated pattern as compared with the squeezee method (see FIG. 4) in which a continuous paste supply is required, an isolated electrode pattern can be formed (see FIG. 5).

Further, an electrode is formed using a laser etching device together with the aforementioned inkjet method in the present invention so that high accuracy and the degree of freedom of an electrode pattern can be enhanced.

That is, if a previously formed electrode pattern groove itself is not uniform or a narrow line width cannot be reproducibly implemented although a metal wiring with a uniform line width can be obtained through the conventional inkjet method, the reliability of a finally formed electrode is also reduced essentially. Conventionally, since only an electrode forming process of filling an electrode pattern groove is simply stressed without a special recognition for an etching process of forming an electrode pattern, the degree of freedom of a final electrode pattern and the formation of an electrode with a uniform line width and thickness itself cannot be finally promoted.

Accordingly, the present invention can provide an electrode in which an electrode pattern groove with a certain array is formed using a laser etching device suitable form a fine patterning process and then filled with a droplet-shaped transparent conductive ink to form a buried transparent electrode so that the reproducibility, accuracy and the degree of freedom of an electrode pattern can be optimally implemented.

Figure 3:
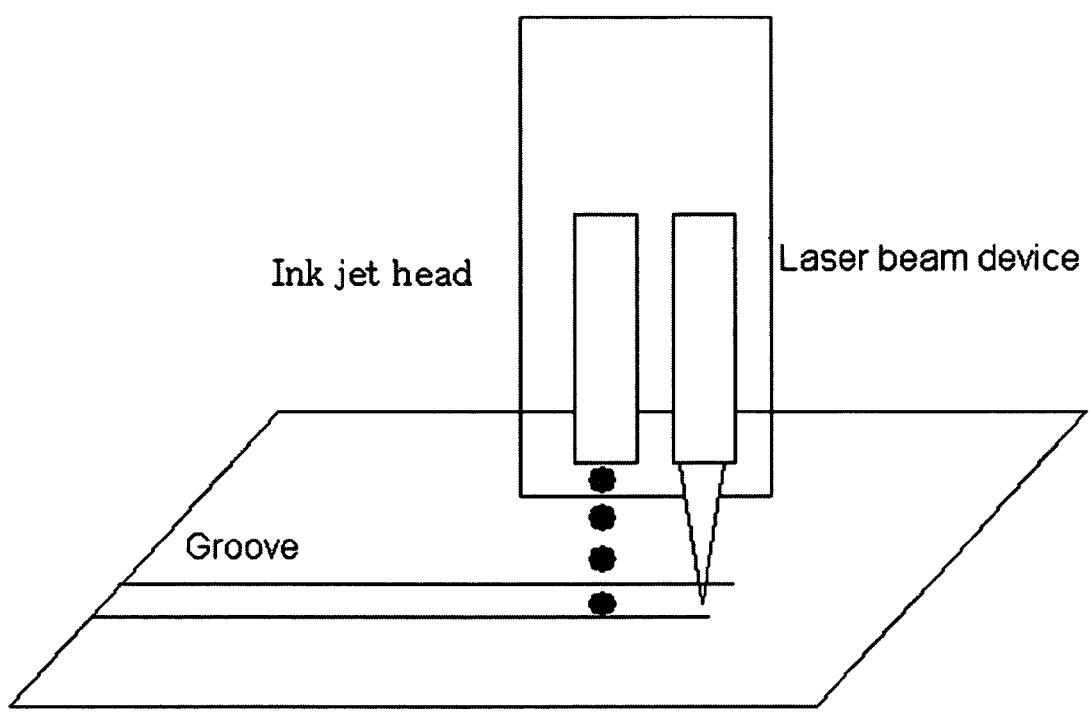
FIG. 3 is a conceptual view illustrating a process of manufacturing a p-n junction semiconductor solar cell, in which a laser device and an inkjet device are simultaneously configured on the same stage.

Particularly, since the aforementioned etching and inkjet processes are processes that essentially require additional devices, respectively, they are conventionally disadvantageous in terms of the speed of a manufacturing process and productivity so as to rearrange or use the devices during the processes. On the contrary, in the present invention, in a case where there is used an electrode manufacturing apparatus in which an etching device, e.g., a laser for engraving electrode pattern grooves with a certain array on one or both surfaces of a p-n junction diode and an inkjet device for filling the formed grooves with a metal substance to form an electrode are arranged on the same stage as shown in FIG. 3, there is an advantage in that the two processes can be simultaneously performed through a single manufacturing process so that the easiness of a manufacturing process, a process speed and productivity can be enhanced, and an additional aligning process for the inkjet device is not required.

The optoelectronic semiconductor device, preferably the solar cell, according to the present invention, may be manufactured using a general method known in the art except that an etching process in which fine electrode patterning is possible using a transparent conducting particle as an electrode substance and an electrode forming process through an inkjet are consecutively or simultaneously performed. As an example of this embodiment, the optoelectronic semiconductor device may be manufactured through a method in that, after a plurality of fine electrode pattern grooves with a certain array have been formed on one or both surfaces of a p-n junction diode through a laser, buried transparent electrodes are formed by filling the grooves with a conductive ink with a transparent conducting particle dispersed therein through an inkjet, and the electrodes are respectively connected to external devices.

Hereinafter, not only a general manufacturing process of the present invention but also features, e.g., etching and electrode forming steps, distinguished the most from the conventional technology will be described in detail.

(1) p-n Junction Diode Forming Step

If a first conductive semiconductor layer (p-type), a p-n junction layer and a second conductive semiconductor layer (n-type) are sequentially formed as well known in the art, a p-n junction diode may be used without a specific limit. Preferably, the p-n junction layer and the second conductive semiconductor layer are formed on a first conductive substrate.

If the first conductive substrate has conductivity and the first type (p-type), it is not specifically limited but a silicone wafer (Si wafer) or the like may be used as an unlimited example. The substrate may have an irregular structure on one or both surfaces of the substrate by performing texturing, or have an antireflection (AR) layer and/or a passivation layer previously formed on a surface of the substrate.

The p-n junction layer and the second conductive layer (e.g., the n-type layer 13) may be manufactured in accordance with a general method well known in the art, and may be formed by inserting and diffusing n-type impurities throughout the entire surface (light incident surface) of the first conductive substrate 14 as an example. At this time, the n-type impurities may be unlimitedly used as a general element well known in the art, i.e., a substance increasing the concentration of electrons. As a concrete example, Group V and/or Group VI elements may be used. Preferably they may be P, $POCl_3$, $P_2O_5$, Te and the like.

(2) Conductive Ink Preparation

If a substance simultaneously having conductivity and transmissivity is used as a substance capable of forming a buried electrode by filling formed grooves therewith, it may be used without a specific limit. As an example, a transparent conducting oxide may be used as the substance.

That is, metal used as a conventional electrode essentially causes the reduction of photoelectric conversion efficiency by reflecting a portion of incident light, while conductive conducting oxides used as a electrode element in the present invention can significantly enhance the photoelectric conversion efficiency by transmitting the whole of light incident onto an incident surface. However, the aforementioned transparent conducting oxides cannot be applied because electroplating is impossible. On the other hand, the aforementioned transparent conductive oxides are applied as buried electrode elements by introducing an inkjet method as the electrode forming method in the present invention so that covering loss can be significantly reduced as compared with a conventional opaque metal electrode, thereby implementing high efficiency.

Indium Tin Oxide (ITO), Fluorine Doped Tin Oxide (FTO), $ZnO_x$, $SnO_2$, $TiO_2$ or a compound thereof may be used as an unlimited example of the transparent conducting oxide. Besides, an element, applicable as the electrode with conductivity and transparency, may also belong to the scope of the present invention.

The size (diameter) of the transparent conducting particle is not specifically limited but may be generally limited depending on the size of a nozzle in an inkjet device intended to use. Since the size of a nozzle for an inkjet currently commercialized is in the range of 20 to a few hundred μm, it is preferred that the diameter of the transparent conducting particle be in the range of 5 nm to 50 μm if possible.

Further, the transparent conducting particle forms a conductive ink as a form dispersed into a dispersing medium. At this time, a general aqueous and/or organic solvent well known in the art may be applied as the dispersing medium. The prepared conductive ink is not specifically limited but may be preferably a colloid type for uniformly dispersing a conductive particle into the dispersing medium and preventing cohesion.

The conductive ink of the present invention may further include a general metal element known in the art so as to enhance conductivity. Ag, Cu, Au, Ti, W, Ni, Cr, Mo, Pb, Pd, Pt or a compound thereof may be used as an non-limiting example of the conductive ink.

In a conventional buried electrode forming technique, a metal electrode is generally filled by engraving a groove on a p-n junction diode, preferably a first type (e.g., p-type) or second type semiconductor layer of the p-n junction diode, and then filling the groove with a metal particle. At this time, it is necessary to form an n++ layer by double doping n-type impurities. However, since general n-type impurities known in the art may be additionally contained in the conductive ink containing the transparent conducting particle for forming the electrode in the present invention, the steps of forming an n++ layer and forming a buried electrode can be progressed as a single process. Accordingly, there is an advantage in that the simplicity of a manufacturing process can be secured, and mass productivity can be implemented.

(3) Etching Step

Next, one or more electrode pattern grooves are formed by partially etching at least one surface of the p-n junction diode, preferably a portion or the whole of a light incident surface.

The surface of the p-n junction diode with an electrode pattern formed thereon may be a surface of a first or second conductive semiconductor layer of the p-n junction diode with the first (p-type) conductive semiconductor layer, a p-n junction layer and the second (n-type) conductive semiconductor layer sequentially formed thereon. Preferably, the surface of the p-n junction diode may be a light incident layer with the second conductive semiconductor layer (the n-type layer 13) formed on the first conductive substrate. Further, although the electrode pattern grooves formed through etching may be a continuous, isolated or mixed type with a certain array, it is not limited thereto.

At this time, although it is preferred that the etching process for forming the grooves be etched by a laser so as to enhance the degree of freedom of pattern formation, other general etching methods known in the art are also applicable.

The laser may use a pulse laser device with high energy per unit time, such as excimer, Nd:Yag or the like. Preferably, the wavelength of a laser beam is a wavelength in the UV region. Further, there is an advantage in that the width and depth of a pattern can be easily adjusted through the power of the laser and the adjustment of a focus distance.

The laser beam scanned on at least one surface of the p-n junction diode applies predetermined energy while being absorbed into the p-n junction diode. Such absorbed energy break bonding between molecules within the p-n junction diode so that a portion of the surface of the p-n junction diode is etched and removed. In a case where the laser beam is repeatedly scanned in such a manner, an electrode wiring is patterned while grooves are being formed on the surface of the p-n junction diode. AS such, if the etching process for a certain region is completed, the laser finely moves to x and y axes, and if such movement is finished, the electrode patterning for the p-n junction diode is processed as described above.

The depth of the formed electrode pattern groove is not specifically limited but is preferably larger than the width of the groove in order to reduce the covering loss of the optoelectronic semiconductor device through electrode formation in a depth direction. As an example, the depth of the formed electrode pattern groove may be in the range of 1 μm to a few tens of μm.

(4) Buried Electrode Formation

After the previously prepared conductive ink has been inserted into the inkjet device, one or more electrode pattern grooves formed on one or both surfaces of the p-n junction diode are filled by jetting the conductive ink through a nozzle of the inkjet device.

The inkjet device refers to a device for jetting a jetting liquid, e.g., a conductive ink through a jetting nozzle. If the inkjet device can perform such a function, it is not specifically limited to shapes, components and the like. Preferably, an inkjet head using a piezo element is attached to the inkjet device, and the diameter of the inkjet nozzle is in the range of 20 to 50 μm if possible. As necessary, n-type impurities may be double doped before the conductive ink is filled in the electrode pattern grooves, and the buried electrode may be simultaneously formed using the conductive ink containing the n-type impurities while forming the n++ layer.

The buried electrode is completed by performing heat treatment to the electrode pattern grooves filled with the transparent conducting particle through the inkjet nozzle. At this time, the temperature and time of the heat treatment is not specifically limited but the heat treatment is preferably performed in a general range know in the art, e.g., in the temperature range of at which a sol solution solvent is removed through evaporation. As an example, a transparent electrode such as ITO may be solidified by performing heat treatment using a sol solution as an ink. Further, a nano silver particle may sufficiently show a property of specific resistance even through heat treatment at a temperature of below 200° C.

In a case where the buried electrode (upper electrode) manufactured in such a manner is contacted with a portion or the whole of a surface of the second conductive semiconductor layer (n-type layer), it becomes a second electrode, and in a case where the buried electrode (upper electrode) is contacted with a portion or the whole of a surface of the first conductive semiconductor layer (p-type layer), it becomes a first electrode.

The aforementioned conductive ink preparation step (2) and etching step (3) may be performed by appropriately changing an order as necessary. Further, the etching step (3) and the buried electrode forming step (4) may be configured through a manufacturing process with two steps. In a case where a manufacturing apparatus with the aforementioned etching and inkjet devices mounted on a single stage are used, there is an advantage in that an electrode can be formed through a unified manufacturing process.

Thereafter, the optoelectronic semiconductor device with the buried electrode formed therein as described above may be manufactured in accordance with a general method known in the art. As an example, there may be included a step of forming a rear surface electrode (e.g., a first or second electrode) contacting a portion or the whole of a conductive semiconductor layer positioned on the opposite surface to a light incident surface of the p-n junction diode, i.e., a rear surface thereof.

At this time, since sunlight is not incident onto the rear surface electrode so that it is unnecessary to specifically narrow the width thereof, the conventional electrode formation technique may be used. Thus, the optoelectronic semiconductor device with the buried electrode formed therein may be implemented in accordance with a general method known in the art. As an example, a first electrode (or a second electrode) positioned on a rear surface of a solar cell may be manufactured using a conductive metal, e.g., silver, copper or the like in accordance with a screen printing, electroless plating and/or electroplating technique.

In order to promote the increase of an amount of light incident onto a light incident surface of the p-n junction diode, there may be further included a step of forming one or more components selected from an antireflection (AR) layer, a passivation layer, texturing and a transparent conducting oxide in the present invention.

As such, a component for increasing an amount of light incident into the inside of the substrate from the outside, e.g., the antireflection (AR) layer may be manufactured in accordance with a general method known in the art. As an example, $TiO_2$, $MgF_2$, $ZnS$, $SiN_x$ and the like may be formed using a thermal resistor, an electron beam, vacuum vapor deposition, sputtering, chemical vapor deposition and the like. Further, if an element constituting the transparent conducting oxide layer can reduce covering loss with conductivity and transparency, the material shape or size thereof is not specifically limited. Although the element may be the same as the transparent conducting oxide particle describe in the aforementioned step (2), it is not limited thereto.

In the optoelectronic semiconductor device configured as described above, if light is incident into the optoelectronic semiconductor device, i.e., the p-n junction, an absorbed photon produces both an electron and a hole, and the produced electron and hole stably exist during their life time. At this time, the electron and hole move to n-type and p-type semiconductor layers due to an electric field existing inside the p-n junction diode, respectively. If the two layers are connected to wires through the respective electrode terminals, a current flows due to a potential difference (photoelectromotive force) produced between the two layers, and the potential difference can be used as external electric power.

Further, the present invention provides an optoelectronic semiconductor device, which includes: (a) a p-n junction diode; and (b) a buried electrode positioned within a plurality of recesses with a certain array formed by etching a portion of a light incident surface of the p-n junction diode, wherein the electrode is a transparent electrode formed from a transparent conducting oxide through which incident light is transmitted.

As described above, the transparent electrode can promote the increase of photoelectric conversion efficiency through the reduction of electrode covering loss by transmitting incident light. At this time, the type of the electrode is not specifically limited but may have a continuous, isolated or mixed type as an example. Further, the transparent electrode additionally includes one or more kinds of n-type elements selected from the group consisting of Group V and Group VI.

The optoelectronic semiconductor device may include a component for increasing an amount of light incident into a portion or the whole of a final light incident surface or quantum efficiency, e.g., one or more components selected from an antireflection (AR) layer, a passivation layer, texturing and a transparent conducting oxide layer. The antireflection layer (AR layer) functions to increase photoelectric efficiency by minimizing sunlight loss through surface reflection, and the passivation layer functions to prevent a leakage current and the damage of a device. The texturing functions to increase an amount of light incident into a semiconductor device by forming diffused reflection due to the irregularity of a surface. Among these components, the transparent conducting oxide layer can preferably enhance the increase of photoelectric conversion efficiency. This is because the transparent conducting oxide layer can simultaneously serve as an antireflection (AR) layer for promoting the increase of an amount of light incident through thickness adjustment and an auxiliary electrode. Although the preferred thickness of the transparent conducting oxide layer is in the range of a thickness ($\lambda/4$) that is about ¼ of the wavelength ($\lambda$) of incident light, it is not limited thereto but may be adjusted within the range in which photoelectric conversion efficiency can be enhanced.

An antireflection (AR) layer is previously formed on the light incident surface before forming a concave portion in the p-n junction diode among the optoelectronic semiconductor devices. Particularly, in a case where a transparent conducting oxide layer exists on the entire surface of the buried transparent electrode formed by etching a portion of a light incident surface of the p-n junction diode with the antireflection (AR) layer previously formed therein, photoelectric conversion efficiency can be remarkably enhanced. This is because an amount of incident light can be significantly increased due to use in combination of the transparent conducting oxide layer and the antireflection (AR) layer existing on the light incident surface, and the sectional area through which a current flows is increased due to use in combination of the transparent electrode and the transparent conducting oxide layer with conductivity serving as an auxiliary electrode so that resistance is improved. At this time, it is preferred that the refractive index of the transparent conducting oxide layer be lower than that of a first type substrate, e.g., silicon.

The optoelectronic semiconductor device is not limited to a configuration of a p-n junction semiconductor. For example, the optoelectronic semiconductor device may be applied all the structures in which the efficiency of a semiconductor device can be changed through a bonding condition of metal bonding such as a solar cell, a Light Emitting Diode (LED) and the like, i.e., in which the efficiency of a semiconductor device can be changed by increasing the effective area of a light emitting portion or light receiving portion due to the structure of metal bonding.

Moreover, the present invention provides an apparatus for manufacturing an optoelectronic semiconductor device, which includes: (a) an etching device for forming one or more electrode pattern grooves with a certain array on one or both surfaces of a p-n junction diode; and (b) an inkjet device for forming an electrode by filling the formed grooves with a conductive substance through an inkjet, wherein the etching and inkjet devices are mounted on a single stage to manufacture a buried electrode through a unified manufacturing process.

Preferably, the etching device is a laser as described above. At this time, the laser may use a laser diode for generating high energy, and the size of a head may be reduced using an optical waveguide such as an optical fiber in an external laser device. The inkjet device is not also limited specifically but may be preferably an inkjet printer with a jetting nozzle.

The aforementioned method of manufacturing the aforementioned optoelectronic semiconductor device, preferably the solar cell is only a specific embodiment, and the present invention is not limited thereto.

INDUSTRIAL APPLICABILITY

As can be seen from the foregoing, in a p-n junction optoelectronic semiconductor device of the present invention, electrode covering loss is significantly reduced by forming a buried transparent electrode using a transparent conducting oxide of which formation is difficult through electroplating so that high efficiency can be implemented, and a metal wiring with a uniform line width and thickness can be obtained as compared with a method of filling grooves through an existing squeezee method so that an isolated pattern can be implemented. Further, since a seed metal forming process for electroplating can be eliminated, and an inkjet process can be progressed on the same stage after laser grooving, there is an advantage in that the throughput of a manufacturing process is large.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

The invention claimed is:

1. A method for manufacturing an optoelectronic semiconductor device having a p-n junction diode, comprising the steps of:
   (a) etching at least one surface of the p-n junction diode in a depth direction to form a plurality of continuous, isolated or mixed type electrode pattern grooves with a certain array; and
   (b) filling the formed grooves with a conductive ink containing a transparent conducting particle through an inkjet and then performing heat treatment to form a buried transparent electrode wherein the electrode is manufactured on a single stage through a unified manufacturing process using (a) a laser device for forming one or more electrode pattern grooves with a certain array on one or both surfaces of a p-n junction diode; and (b) an apparatus for manufacturing an optoelectronic semiconductor device with a built-in inkjet device for filling the formed grooves with a conductive ink containing a conductive particle to form an electrode pattern.

2. The method according to claim 1, wherein the etching step is carried out by laser.

3. The method according to claim 1, wherein the transparent conducting particle is one or more kinds of transparent conducting oxides selected from the group consisting of Indium Tin Oxide (ITO), Fluorine Doped Tin Oxide (FTO), $ZnO_x$ and $TiO_2$.

4. The method according to claim 1, wherein the conductive ink additionally includes one or more kinds of metals selected from the group consisting of Cu, Au, Ti, W, Ni, Cr, Mo, Pb, Pd and Pt.

5. The method according to claim 1, wherein the conductive ink additionally includes one or more kinds of n-type elements selected from the group consisting of Group V and Group VI.

6. The method according to claim 4, wherein the manufacturing method uses a conductive ink containing the n-type element to simultaneously form an n++ layer and a buried electrode.

7. The method according to claim 1, wherein the surface of the p-n junction diode with the electrode pattern groove formed thereon is a light incident surface.

8. The method according to claim 1, wherein the width of the electrode pattern groove is 1 μm or more, and the depth thereof is larger than the width of the groove.

* * * * *